(12) United States Patent
Tang et al.

(10) Patent No.: US 10,896,993 B2
(45) Date of Patent: Jan. 19, 2021

(54) SPHERICAL ARRAY OF OPTOELECTRONICS FOR FREE SPACE OPTICAL COMMUNICATION AND POWER DELIVERY, AND NEUROMORPHIC INTERCONNECTION

(71) Applicant: INTERNATIONAL BUSINESS MACHINES CORPORATION, Armonk, NY (US)

(72) Inventors: Jianshi Tang, Elmsford, NY (US); Ning Li, White Plains, NY (US); Qing Cao, Westchester, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/381,511

(22) Filed: Apr. 11, 2019

(65) Prior Publication Data
US 2020/0328323 A1     Oct. 15, 2020

(51) Int. Cl.
| | |
|---|---|
| *H01L 31/18* | (2006.01) |
| *H04B 10/11* | (2013.01) |
| *H01L 33/58* | (2010.01) |
| *H01L 31/0232* | (2014.01) |
| *H01L 33/00* | (2010.01) |

(52) U.S. Cl.
CPC ...... *H01L 31/186* (2013.01); *H01L 31/02327* (2013.01); *H01L 33/0095* (2013.01); *H01L 33/58* (2013.01); *H04B 10/11* (2013.01)

(58) Field of Classification Search
CPC ............ H01L 31/186; H01L 31/02327; H01L 33/0095; H01L 33/58; H04B 10/11
See application file for complete search history.

(56) References Cited

U.S. PATENT DOCUMENTS

| | | | |
|---|---|---|---|
| 5,909,296 | A | 6/1999 | Tsacoyeanes |
| 9,438,337 | B2 | 9/2016 | Byers |
| 9,515,729 | B2 | 12/2016 | Murshid et al. |
| 10,538,028 | B2 * | 1/2020 | Rogers ............... B32B 27/285 |

(Continued)

FOREIGN PATENT DOCUMENTS

WO    WO 2015/096862    7/2018

OTHER PUBLICATIONS

Yan et al., "Controlled mechanical buckling for origami-inspired construction of 3D microstructures in advanced materials", HHS Public Access, Adv Funct Mater. Author manuscript; available in PMC Apr. 25, 2017, 20 pages.

(Continued)

*Primary Examiner* — Zandra V Smith
*Assistant Examiner* — Andre C Stevenson
(74) *Attorney, Agent, or Firm* — Tutunjian & Bitetto, P.C.; Anthony Curro (57) ABSTRACT

A method and an apparatus are provided. The apparatus includes a three-dimensional semiconductor structure having a spherical array of fixed-position optoelectronic devices arranged over a relaxed elastomer by a controlled unbuckling process that orients the fixed-position optoelectronic devices to face in different directions in the spherical array to communicate in the different directions without motion of the apparatus and the fixed-position optoelectronic devices of the apparatus.

16 Claims, 12 Drawing Sheets

(56) References Cited

U.S. PATENT DOCUMENTS

2009/0162071 A1    6/2009  Refai et al.
2016/0080077 A1    3/2016  Joseph et al.

OTHER PUBLICATIONS

Xu et al., Assembly of microlnanomaterials into complex, three-dimensional architectures by compressive buckling, sciencemag.org Science, Jan. 9, 2015—vol. 347 Issue 6218, 38 pages.
Sevincer et al., "Prototyping Multi-Transceiver Free-Space-Optical Communication Structures", IEEE ICC 2010, May 2010, 6 pages.

* cited by examiner

SPHERICAL ARRAY OF OPTOELECTRONICS FOR FREE SPACE OPTICAL COMMUNICATION AND POWER DELIVERY, AND NEUROMORPHIC INTERCONNECTION

BACKGROUND

The present invention generally relates to optoelectronics, and more particularly to a spherical array of optoelectronics for free space optical communication and power delivery, and neuromorphic interconnection.

Current approaches to free space optical communication and power delivery suffer from deficiencies including, but not limited to, emitting in all directions, which is a waste of power, and alignment of moving mechanical parts, which is slow and energy consuming. Hence, there is a need for an improved approach for free space optical communication and power delivery.

SUMMARY

According to an aspect of the present invention, a method is provided for forming a three-dimensional (3D) semiconductor structure. The method includes etching a structure having a device layer over a buried oxide (BOX) that, in turn, is over a handling wafer, to create edge undercuts relative to an underside of the BOX, the device layer including fixed-position optoelectronic devices. The method further includes depositing a dielectric onto the structure to cover exposed surfaces of the device layer. The method also includes patterning the dielectric and exposing anchors in the dielectric. The method additionally includes immersing the structure in a corrosive material to remove the BOX and obtaining a print. The method further includes transferring the print onto a water soluble tape while removing the handling wafer. The method also includes attaching the water soluble tape having the print onto a elastomer that is pre-strained. The method further additionally includes dissolving the water soluble tape to obtain a tape-free resultant structure. The method also includes releasing a strain on the elastomer to compressively unbuckle the tape-free resultant structure and form the 3D semiconductor structure on a relaxed version of the elastomer. The 3D semiconductor structure includes a spherical array having the fixed-position optoelectronic devices oriented to face and communicate in different directions without motion of the apparatus and the fixed-position optoelectronic devices of the apparatus.

According to another aspect of the present invention, an apparatus is provided. The apparatus includes a three-dimensional semiconductor structure having a spherical array of fixed-position optoelectronic devices arranged over a relaxed elastomer by a controlled unbuckling process that orients the fixed-position optoelectronic devices to face in different directions in the spherical array to communicate in the different directions without motion of the apparatus and the fixed-position optoelectronic devices of the apparatus.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a spherical array of optoelectronics for free space optical communication and power delivery.

In an embodiment, the present invention provides a spherical array of optoelectronic devices that face different directions and can be electrically switched ON/OFF separately, so that it can enable power-efficient directional optical communication and power delivery without moving mechanical parts. In this way, the present invention can overcome the problem of emitting in all directions which is a waste of power. Also, the present invention can overcome the problem of aligning moving mechanical parts to effect multi-direction emitting which is both slow and energy consuming.

The manner in which the spherical array is formed can be considered as an origami or controlled unbuckling process, as is readily evident to one of ordinary skill in the art, given the teachings of the present invention provided herein.

Exemplary optoelectronic devices to which the present invention can be applied include, for example, but are not limited to, photodiodes, phototransistors, photomultipliers, opto-isolators, integrated optical circuits (IOCs), photoresistors, charge coupled devices (CCDs), light emitting diodes (LEDs), lasers, and so forth. The preceding listing is merely illustrative, as readily appreciated by one of ordinary skill in the art, given the teachings of the present invention provided herein. In an embodiment, the present invention can include light receiving devices and/or light emitting devices. These devices can be individually powered on or off to avoid unnecessary power consumption as well as other advantages readily appreciated by one of ordinary skill in the art.

Figure 1:
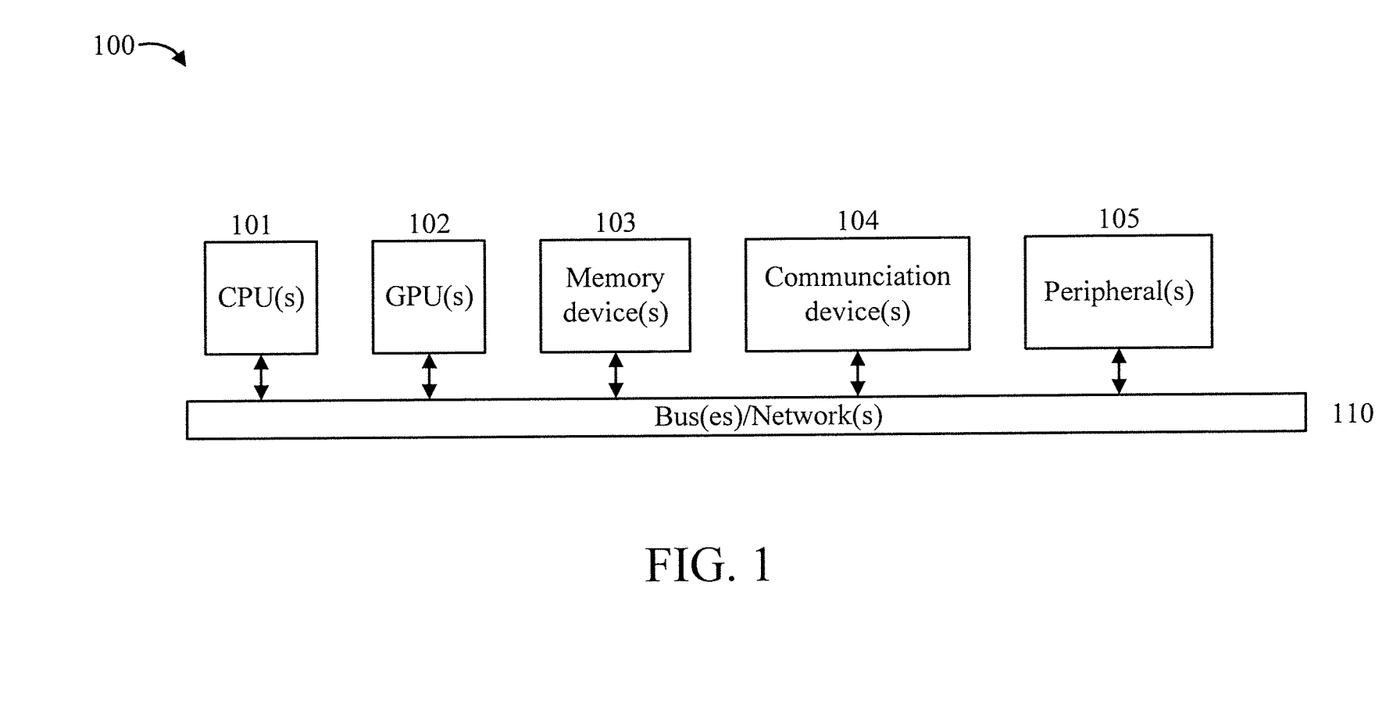
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules in order to transform the computer processing system into a special purpose computer configured to implement various aspects of the present invention. In an embodiment, special purpose hardware (e.g., Application Specific Integrated Circuits, and so forth) can be used to implement various aspects of the present invention. For example, computer processing system 100 can be used to control a manufacturing system that manufactures a spherical array of optoelectronics for free space optical communication and power delivery.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Some of the many attendant advantages of the present invention include, but are not limited to, low cost since the device is essentially a simple device with driving circuits. Another advantage is compactness, as the device size is of on the order of tens of microns. Yet another advantage is security, as the device uses line of sight transmission, thus preventing hacking from outside a room employing the invention. Still another advantage is lower power as the device is capable of directional transmissions.

Figure 2:
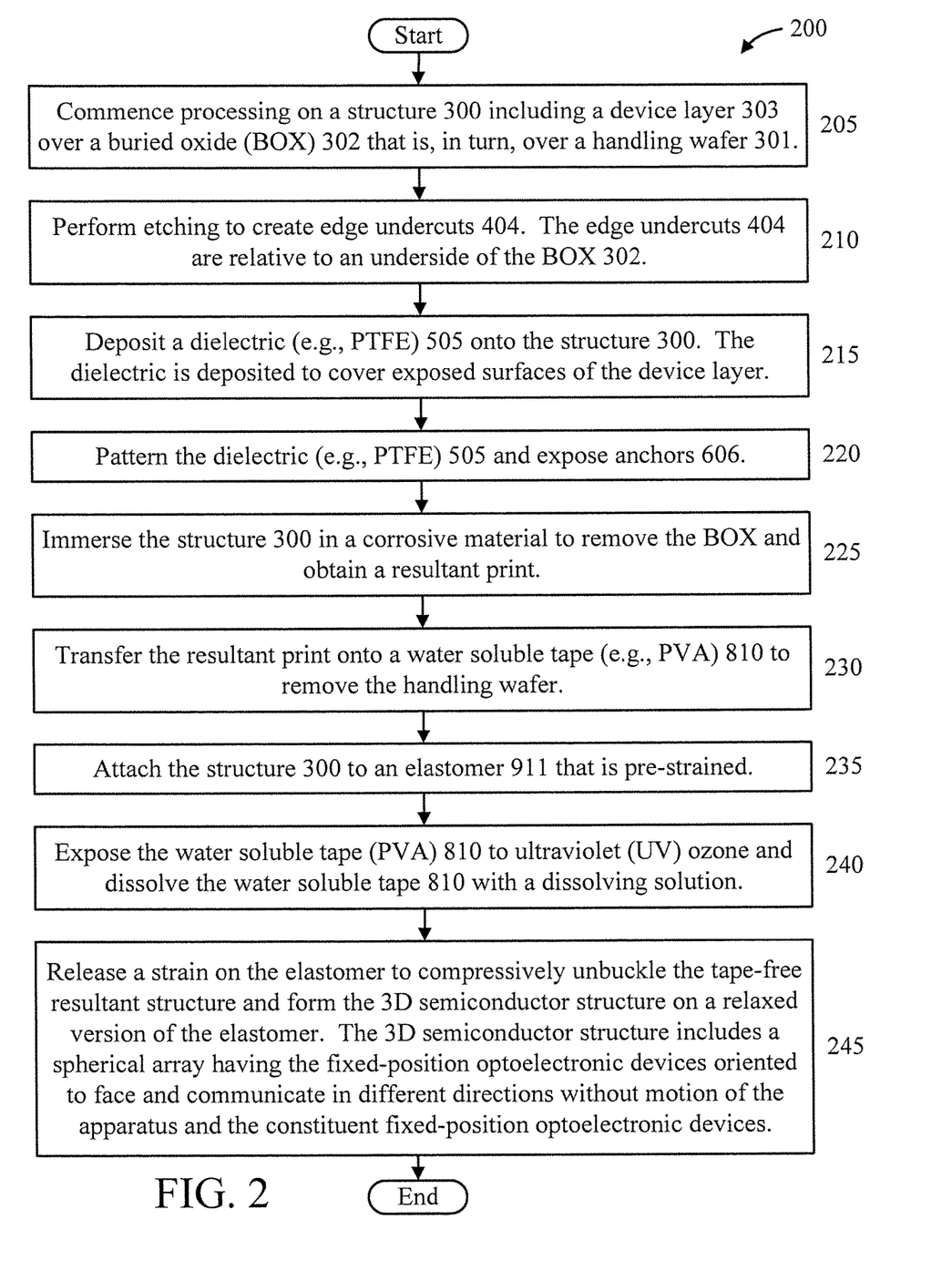
FIG. 2 is a flow diagram showing an exemplary method for forming a spherical array of optoelectronics for free space optical communication and power delivery, in accordance with an embodiment of the present invention.

FIG. 2 is a flow diagram showing an exemplary method 200 for forming a spherical array of optoelectronics for free space optical communication and power delivery, in accordance with an embodiment of the present invention. Method 200 includes blocks 205 through 245, with results of each of the blocks respectively shown in FIGS. 3-11.

Figure 3:
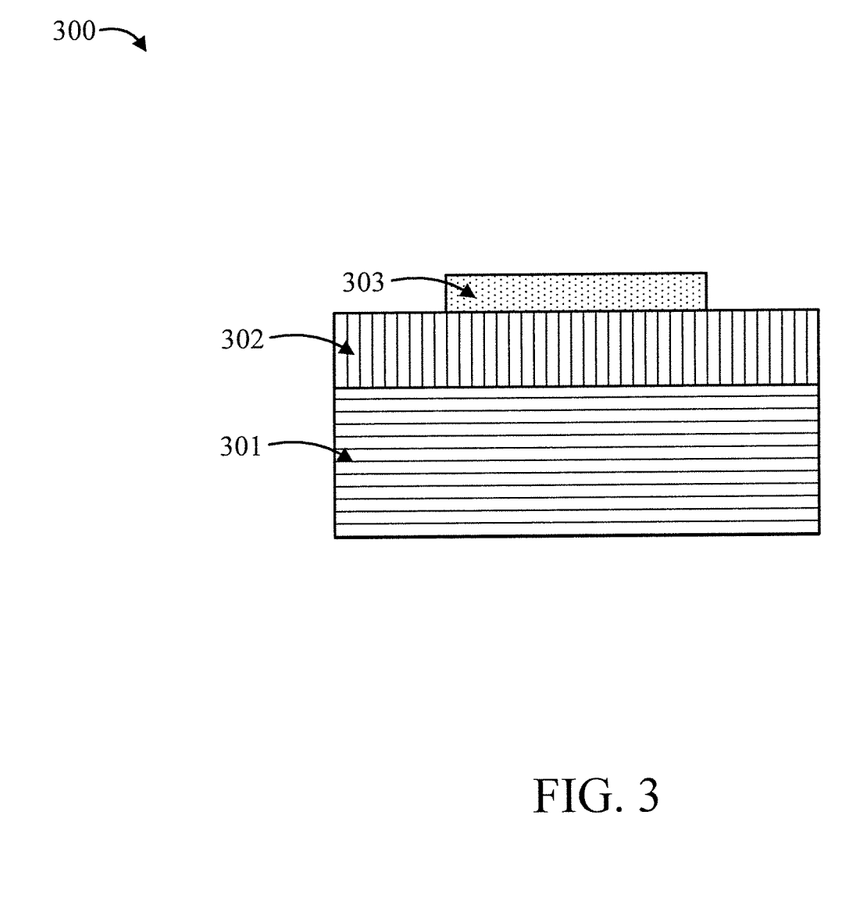
FIG. 3 graphically shows a result of block 205 of the method of FIG. 2, in accordance with an embodiment of the present invention.

At block 205, commence processing on a structure 300 including a device layer 303 over a buried oxide (BOX) 302 that is, in turn, over a handling wafer 301. The device layer 303 includes 2D optoelectronic devices. At least one of the devices can be and/or otherwise include an antenna and/or an optical waveguide. Other types of optoelectronic devices are described herein for the sake of illustration. Each of the optoelectronic devices is formed to be selectively (separately) switched on or off. To that end, each of the optoelectronic devices may include or may be responsive to a semiconductor and/or optical switch. The handling wafer 301 can be formed from, for example, Silicone, Silicone On Insulator (SOI), etc. Reference numeral 300 is used to continually denote the structure as it evolves over the blocks of method 200. FIG. 3 graphically shows a result of block 205, in accordance with an embodiment of the present invention.

Figure 4:
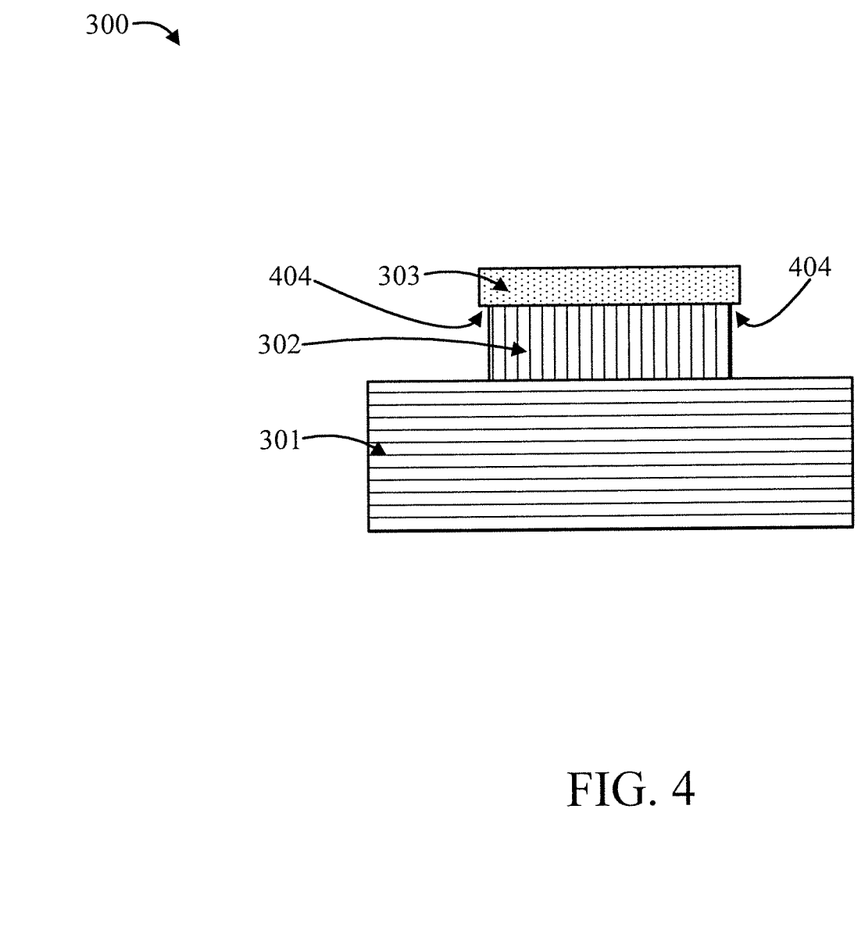
FIG. 4 graphically shows a result of block 210 of the method of FIG. 2, in accordance with an embodiment of the present invention.

At block 210, perform etching to create edge undercuts 404. In an embodiment, the edge undercuts 404 are relative to an underside of the BOX 302. In an embodiment, the etching involves Hydrofluoric acid etching. Of course, other types of materials, other types of etching, and/or other types of processes can be used to create the edge undercuts 404. FIG. 4 graphically shows a result of block 210, in accordance with an embodiment of the present invention.

Figure 5:
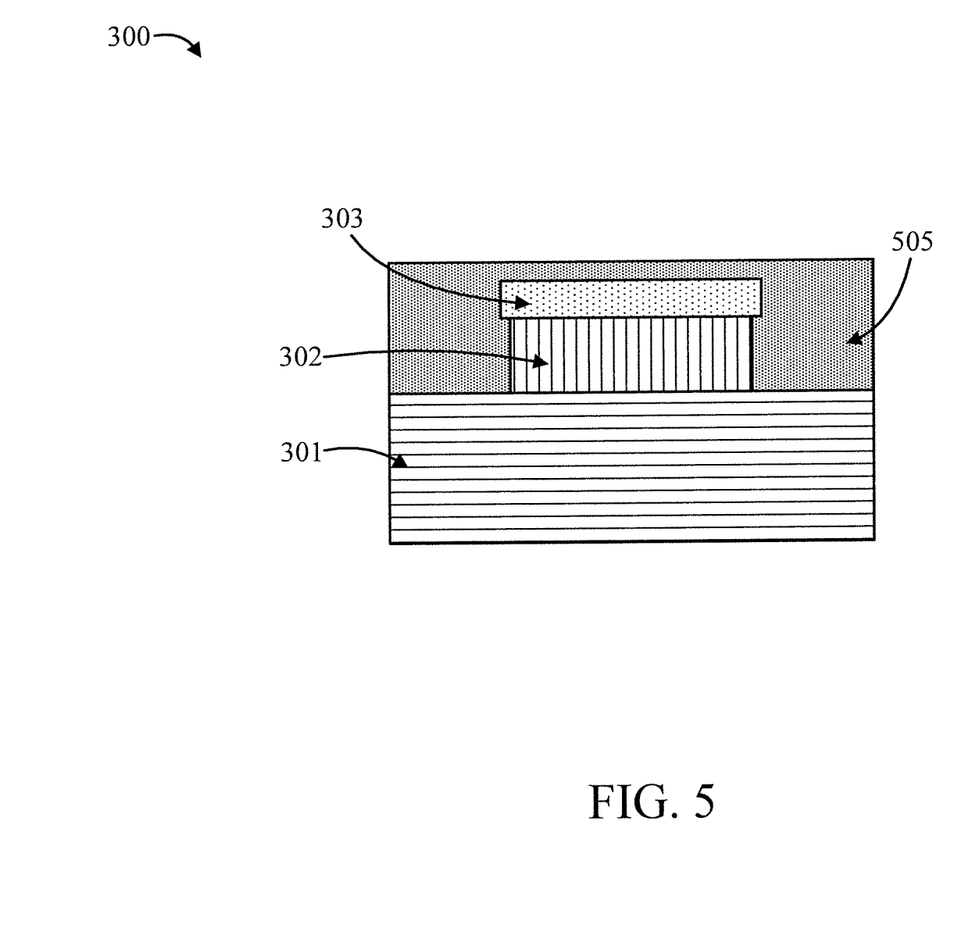
FIG. 5 graphically shows a result of block 215 of the method of FIG. 2, in accordance with an embodiment of the present invention.

At block 215, deposit a dielectric 505 onto the structure 300. In an embodiment, the dielectric is deposited to cover exposed surfaces of the device layer. In an embodiment, the dielectric is spun coated onto the structure. In an embodiment, Polytetrafluoroethylene (PTFE) is deposited (e.g., spun coated) onto the structure 300. Of course, other deposition processes and/or other dielectrics can also be used, while maintaining the spirit of the present invention. For example, Atomic Layer Deposition (ALD), Chemical Vapor Deposition (CVD), sputtering, and other deposition processes can be used. FIG. 5 graphically shows a result of block 215, in accordance with an embodiment of the present invention.

Figure 6:
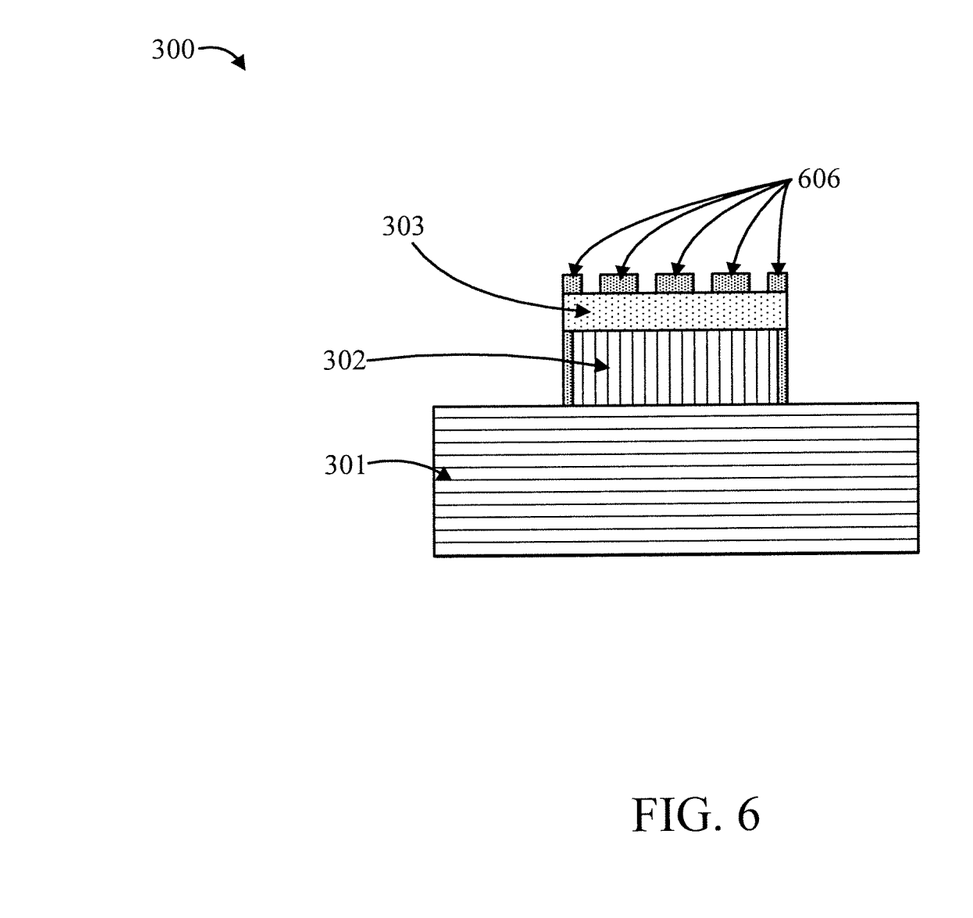
FIG. 6 graphically shows a result of block 220 of the method of FIG. 2, in accordance with an embodiment of the present invention.

At block 220, pattern the dielectric (e.g., PTFE) 505 and expose anchors 606. Lithographic and/or other patterning processes can be used. The anchors 606 are patterned PTFE material that will be embedded in the elastomer. FIG. 6 graphically shows a result of block 220, in accordance with an embodiment of the present invention.

Figure 7:
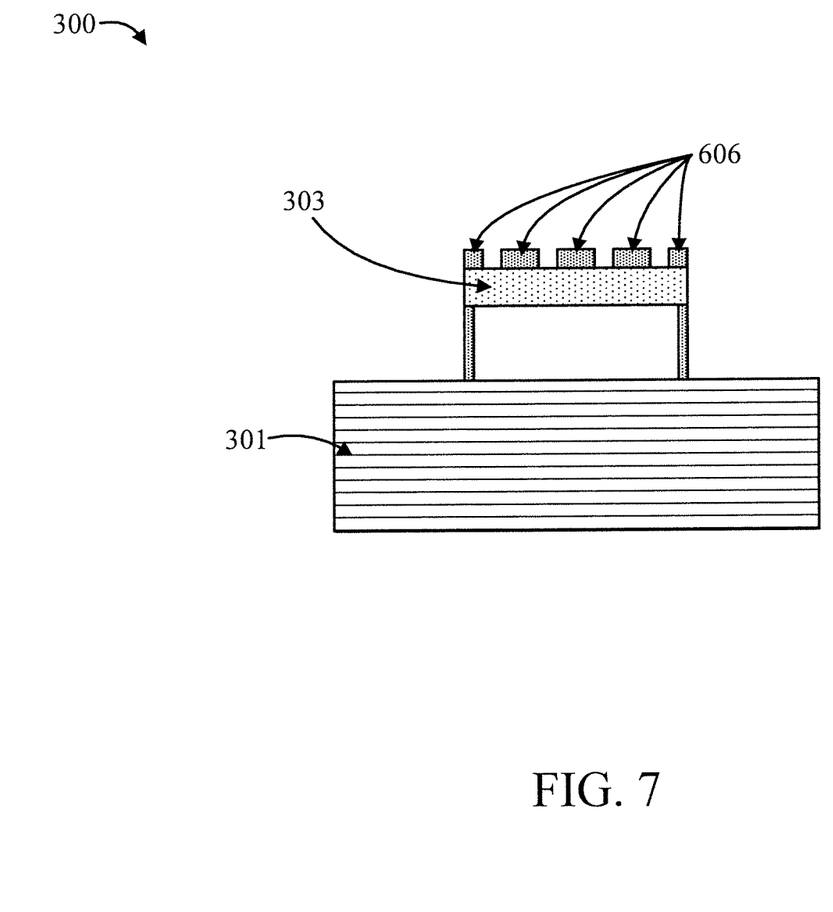
FIG. 7 graphically shows a result of block 225 of the method of FIG. 2, in accordance with an embodiment of the present invention.

At block 225, immerse the structure 300 in a corrosive material to remove the BOX and obtain a resultant print. In an embodiment, the corrosive material is an acid. In embodiment, the acid is Hydrogen Fluoride. Of course, other corrosive materials/acids can be used, while maintaining the spirit of the present invention. For example, buffered oxide etch, diluted HF, etc. FIG. 7 graphically shows a result of block 225, in accordance with an embodiment of the present invention.

Figure 8:
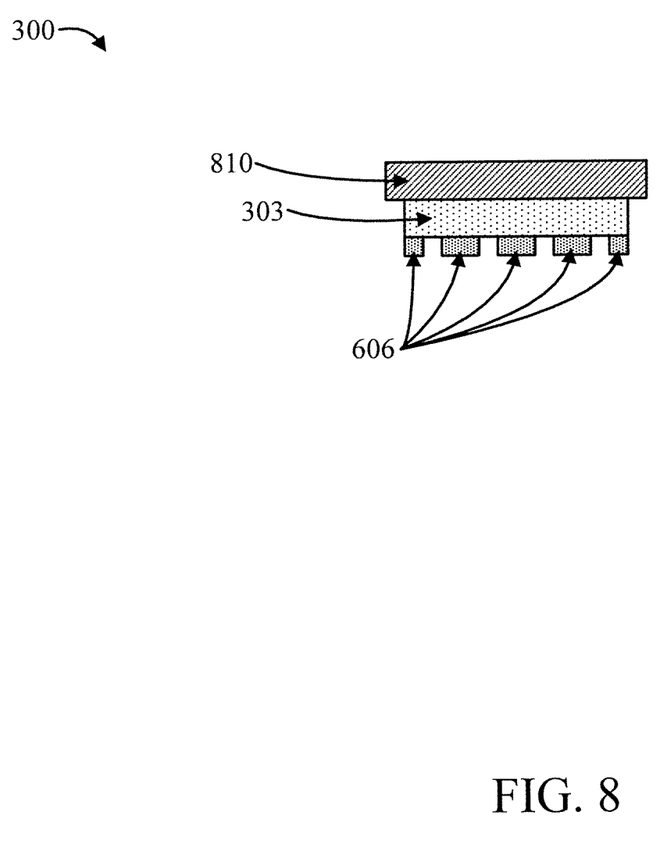
FIG. 8 graphically shows a result of block 230 of the method of FIG. 2, in accordance with an embodiment of the present invention.

At block 230, transfer the resultant print onto a water soluble tape 810 to remove the handling wafer. In an embodiment, the resultant print is transferred onto polyvinyl alcohol (PVA). Of course, other water soluble materials can be used, while maintaining the spirit of the present invention. FIG. 8 graphically shows a result of block 230, in accordance with an embodiment of the present invention. The devices are flipped and the anchors are pressed into the elastomer.

Figure 9:
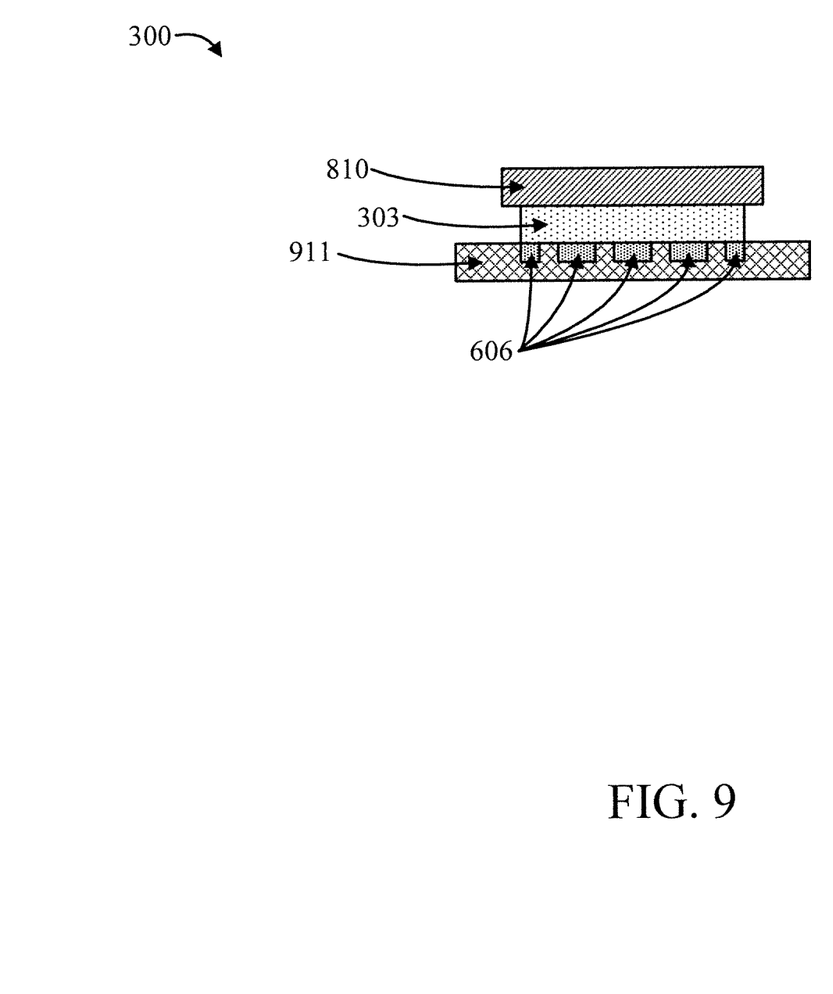
FIG. 9 graphically shows a result of block 235 of the method of FIG. 2, in accordance with an embodiment of the present invention.

At block 235, attach the structure 300 to an elastomer 911 that is pre-strained. In an embodiment, the structure 300 is attached to Silicone. Of course, other pre-strained elastomers can be used, while maintaining the spirit of the present invention. For example, polydimethylsiloxane (PDMS) can be used. Various approaches can be used to pre-strain the elastomer. For example, some approaches for pre-straining the elastomer include, but are not limited to, stretching the elastomer and then fixing it using a mechanical fixture (e.g., screws). FIG. 9 graphically shows a result of block 235, in accordance with an embodiment of the present invention.

Figure 10:
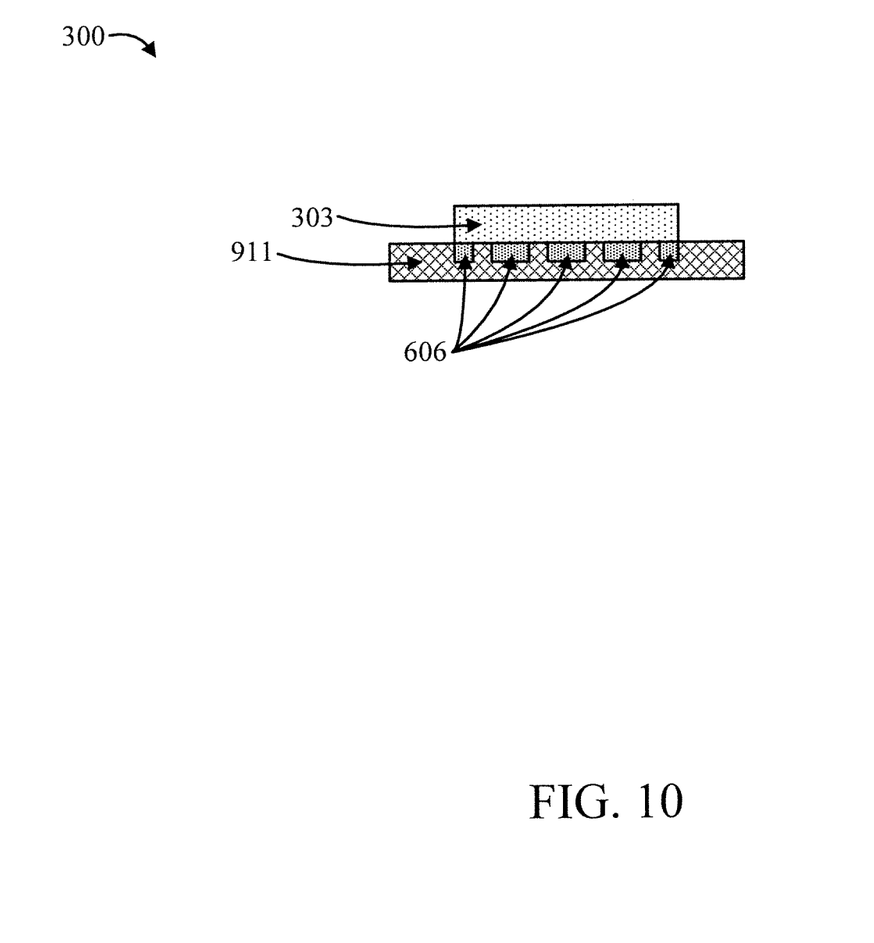
FIG. 10 graphically shows a result of block 240 of the method of FIG. 2, in accordance with an embodiment of the present invention.

At block 240, expose the water soluble tape (PVA) 810 to ultraviolet (UV) ozone and dissolve the water soluble tape (PVA) 810 with a dissolving solution (e.g., hot water above a threshold temperature or within a threshold range). FIG. 10 graphically shows a result of block 240, in accordance with an embodiment of the present invention.

Figure 11:
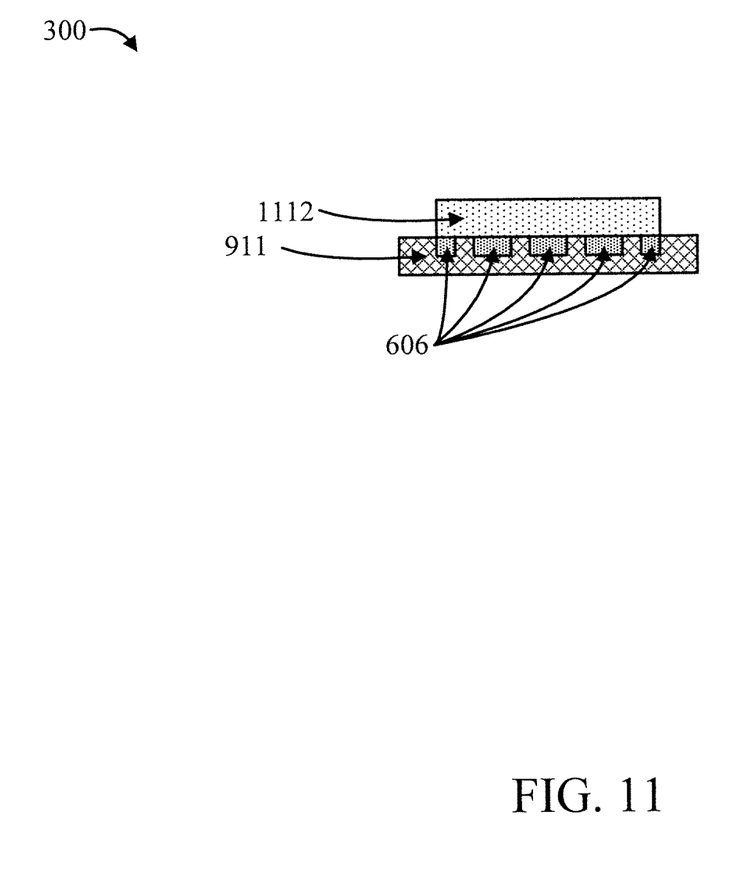
FIG. 11 graphically shows a result of block 245 of the method of FIG. 2, in accordance with an embodiment of the present invention.

At block 245, release a strain on the elastomer to compressively unbuckle the tape-free resultant structure and form a 3D semiconductor structure 1112 on a relaxed version of the elastomer 911. The 3D semiconductor structure includes a spherical array having the fixed-position optoelectronic devices oriented to face and communicate in different directions without motion of the apparatus and the constituent fixed-position optoelectronic devices. The release of strain in the elastomer can be done by, for example, removing the mechanical fixture that applies the strain.

Hence, block 245 can be considered an unbuckling process that "unbuckles" and/or otherwise releases the strain to relax the elastomer 911 and enable the attached device layer 303 to become the 3D semiconductor structure 1112 having the spherical array of fixed-position optoelectronic devices. FIG. 11 graphically shows a result of block 245, in accordance with an embodiment of the present invention.

Moreover, block 250 can also be considered to be and/or otherwise involve an origami process applied to semiconductor structures and related materials instead of paper. To that end, the relaxation of the elastomer 911 results in and forms the spherical array. Hence, a designer will consider the resultant shape to be obtained (e.g., here spherical, although other shapes can be created, depending upon the implementation and any applicable requirements on the operation of the resultant device), the relaxation rate of the elastomer and other design features as readily contemplated by one of ordinary skill in the art, and design the various facets/outer surfaces to ultimately arrange themselves in a desired end shape in order to be able to perform multi-directional communication without moving parts and without having to transmit in all directions at the same time. Rather, more directional transmissions can be performed using the present invention, for example, as shown in FIG. 12.

Hence, block 245 can be considered to involve a transformation of two-dimensional (2D) structures in the device layer into a 3D layout as the 3D semiconductor structure 1112. In this way, complex 3D optoelectronic structures can be realized by unbuckling 2D optoelectronic structures.

Figure 12:
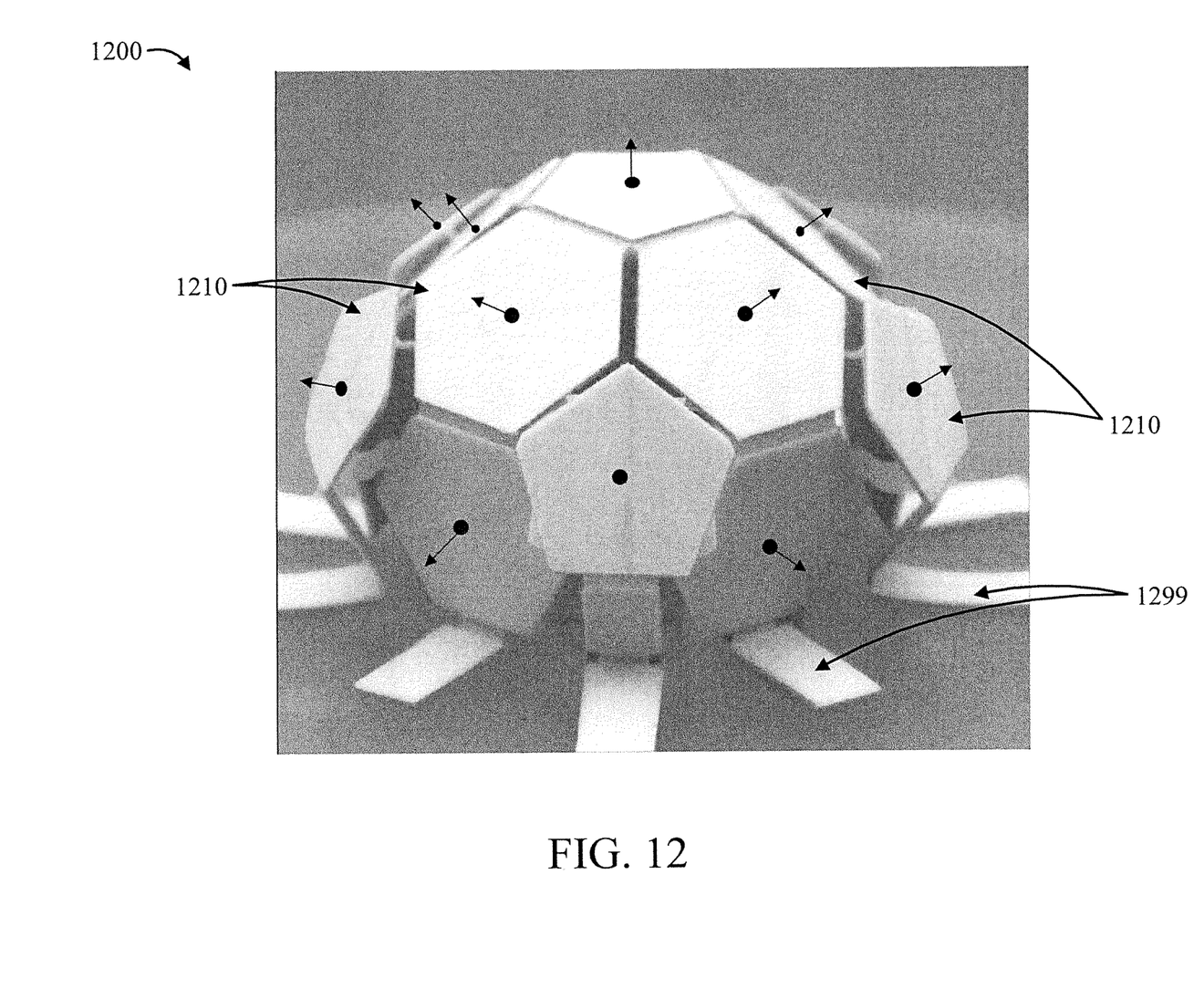
FIG. 12 is a diagram showing a final configuration of a structure formed by method 200, in accordance with an embodiment of the present invention.

FIG. 12 is a diagram showing a final configuration 1200 of structure 300 formed by method 200, in accordance with an embodiment of the present invention.

In the illustrative example of FIG. 12, multiple hexagon-shaped facets 1210 are shown in the final configuration 1200. In an embodiment, there can be spaces between the facets 1210. In this way, device cooling can be achieved. On each of the hexagon-shaped facets 1210, an optoelectronic device is located, as depicted by the circle that is centered in the facets 1210. The optoelectronic devices could be located in other locations on the facets 1210, depending upon the implementation. Each of the optoelectronic devices on the hexagon-shaped facets 1210 face a direction depicted by the attached arrow. In this way, multi-directional optoelectronic communication can be achieved without moving parts, wasted power, and so forth. For example, one or more of the optoelectronic devices can be transmitting in different/multiple directions without any moving parts that can suffer deficiencies such as coming out of alignment, becoming bound, ceasing to move, and so forth. These and other advantages of the final configuration 1200 of structure 300 shown in FIG. 12 are readily determined by one of ordinary skill in the art given the teachings of the present invention provided herein.

In an embodiment, the final configuration 1200 of structure 300 can include legs 1299 or a stand or other structure formed by the unbuckling process that elevates the main portion of the structure 300. Hence, the shape of the final configuration need not be symmetrical, depending upon the implementation.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not, preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a three-dimensional (3D) semiconductor structure, comprising:
    etching a structure having a device layer over a buried oxide (BOX) that, in turn, is over a handling wafer, to create edge undercuts relative to an underside of the BOX, the device layer including fixed-position optoelectronic devices;
    depositing a dielectric onto the structure to cover exposed surfaces of the device layer;
    patterning the dielectric and exposing anchors in the dielectric;
    immersing the structure in a corrosive material to remove the BOX and obtaining a print;
    transferring the print onto a water soluble tape while removing the handling wafer;
    attaching the water soluble tape having the print onto a elastomer that is pre-strained;
    dissolving the water soluble tape to obtain a tape-free resultant structure; and
    releasing a strain on the elastomer to compressively unbuckle the tape-free resultant structure and form the 3D semiconductor structure on a relaxed version of the elastomer, the 3D semiconductor structure comprising a spherical array having the fixed-position optoelectronic devices oriented to face and communicate in different directions without motion of the apparatus and the fixed-position optoelectronic devices of the apparatus.

2. The method of claim 1, further comprising exposing the water soluble tape to ultraviolet ozone prior to dissolving the water soluble tape with the dissolving solution.

3. The method of claim 1, wherein the structure is etched using Hydrofluoric acid.

4. The method of claim 1, wherein the dielectric is Polytetrafluoroethylene.

5. The method of claim 1, wherein the dielectric is deposited using a spin coating process.

6. The method of claim 1, wherein the corrosive material is Hydrogen Fluoride.

7. The method of claim 1, wherein the water soluble tape is formed of polyvinyl alcohol.

8. The method of claim 1, wherein the pre-strained elastomer comprises Silicone.

9. The method of claim 1, wherein the water dissolving tape is dissolved using a dissolving solution selected from the group consisting of water above a threshold temperature and water within a threshold temperature range.

10. The method of claim 1, wherein the optoelectronic devices comprise at least one optoelectronic device selected from the group consisting of a photodiode, a phototransistor, a photomultiplier, an opto-isolator, an integrated optical circuits (IOC), a photoresistor, a charge coupled device (CCD), and a light emitting diode (LED).

11. The method of claim 1, wherein the anchors exposed in the dielectric anchor the device layer to the pre-strained elastomer.

12. The method of claim 1, wherein said releasing step reduces an overall size of the device layer to form the 3D semiconductor structure.

13. The method of claim 1, wherein positions of the fixed-position optoelectronic devices are unset until said releasing step which fixed the positions of the fixed-position optoelectronic devices on faces of the spherical array.

14. The method of claim 1, wherein said releasing step imposes a transformation of two-dimensional (2D) structure versions of the fixed-position opto-electronic devices in the device layer into 3D versions of the fixed-position optoelectronic devices in the the 3D semiconductor structure.

15. The method of claim 1, further comprising forming an antenna in the device layer prior to said etching step.

16. The method of claim 1, further comprising forming an optical waveguide in the device layer prior to said etching step.

\* \* \* \* \*